(12) United States Patent
Zohar

(10) Patent No.: US 7,137,082 B1
(45) Date of Patent: Nov. 14, 2006

(54) REDUCED ARCHITECTURE PROCESSING PATHS

(75) Inventor: Sharon Zohar, San Jose, CA (US)

(73) Assignee: Magma Design Automation Inc., Santa Clara, CA (US)

( * ) Notice: Subject to any disclaimer, the term of this patent is extended or adjusted under 35 U.S.C. 154(b) by 220 days.

(21) Appl. No.: 10/812,579

(22) Filed: Mar. 29, 2004

Related U.S. Application Data

(60) Provisional application No. 60/458,910, filed on Mar. 28, 2003.

(51) Int. Cl.
*G06F 17/50* (2006.01)

(52) U.S. Cl. .................. 716/3; 716/1; 716/18
(58) Field of Classification Search ............. 716/1–5, 716/17–18; 703/1, 2, 20
See application file for complete search history.

(56) References Cited

U.S. PATENT DOCUMENTS

| | | | | |
|---|---|---|---|---|
| 5,243,538 A | * | 9/1993 | Okuzawa et al. .............. 716/5 |
| 5,345,393 A | * | 9/1994 | Ueda ........................... 716/18 |
| 5,416,719 A | * | 5/1995 | Pribetich ....................... 716/2 |
| 5,519,627 A | | 5/1996 | Mahmood et al. .......... 364/488 |
| 5,521,836 A | | 5/1996 | Hartoog et al. ............. 364/491 |
| 5,586,046 A | * | 12/1996 | Feldbaumer et al. ......... 716/18 |
| 5,586,047 A | | 12/1996 | Imahashi .................... 364/491 |
| 5,659,484 A | | 8/1997 | Bennett et al. ............. 364/491 |
| 5,748,497 A | * | 5/1998 | Scott et al. ................. 702/181 |
| 5,812,417 A | | 9/1998 | Young ........................ 364/491 |
| 5,838,583 A | | 11/1998 | Varadarajan et al. ........ 364/491 |
| 5,841,663 A | | 11/1998 | Sharma et al. .............. 364/490 |
| 5,850,349 A | | 12/1998 | Hirai et al. ................. 364/491 |
| 6,026,222 A | | 2/2000 | Gupta et al. ........... 395/500.06 |
| 6,056,784 A | | 5/2000 | Stanion ........................ 716/5 |
| 6,086,629 A | | 7/2000 | McGettigan et al. .......... 716/12 |
| 6,145,117 A | | 11/2000 | Eng ............................ 716/18 |
| 6,163,876 A | | 12/2000 | Ashar et al. ................... 716/5 |
| 6,286,128 B1 | | 9/2001 | Pileggi et al. ................ 716/18 |
| 6,430,734 B1 | | 8/2002 | Zahar ......................... 716/12 |
| 6,434,734 B1 | | 8/2002 | Zahar ......................... 716/12 |
| 6,438,736 B1 | | 8/2002 | Zahar ......................... 716/12 |

(Continued)

OTHER PUBLICATIONS

P. Ienne et al., "Practical Experiences with Standard-Cell Based Datapath Design Tools—Do We Really Need Regular Layouts?", 24.4, Jun. 1998, pp. 396-401.

(Continued)

*Primary Examiner*—Jack Chiang
*Assistant Examiner*—Nghia M. Doan
(74) *Attorney, Agent, or Firm*—Haverstock & Owens LLP

(57) ABSTRACT

A basic Boolean circuit is a transistor circuit commonly used in industry to produce the logic of a particular Boolean gate. A sequence of standard Boolean circuits disposed along the processing path of an integrated circuit define a predetermined truth table representing the relationship of inputs and outputs of the processing path. A reduced-transistor circuit is generated that is defined by the same truth table as the sequence of standard Boolean logic circuits, but is not definable by a sequence of standard Boolean logic circuits. A processing path of an integrated circuit is programmed with the reduced-transistor circuit instead of the sequence of standard Boolean circuits, thereby reducing the time delay of the processing path and the power consumed by the circuit. The reduced-transistor circuit may be generated in response to receiving a programming instruction defining a sequence of Boolean gates. Alternatively, the reduced-transistor circuit may be selected from a pre-established library storing a plurality of Boolean sequences correlated to a respective plurality of complimentary reduced-transistor circuits.

17 Claims, 16 Drawing Sheets

U.S. PATENT DOCUMENTS

| | | | |
|---|---|---|---|
| 6,520,063 B1 * | 2/2003 | Schluter | 91/367 |
| 6,530,063 B1 * | 3/2003 | Andreev et al. | 716/3 |
| 6,544,806 B1 * | 4/2003 | Snider | 438/17 |
| 6,584,605 B1 | 6/2003 | Zahar | 716/10 |
| 6,587,990 B1 * | 7/2003 | Andreev et al. | 716/2 |
| 6,606,737 B1 | 8/2003 | Zahar | 716/12 |
| 6,687,892 B1 | 2/2004 | Zahar | 716/12 |
| 6,829,753 B1 * | 12/2004 | Lee et al. | 716/5 |

OTHER PUBLICATIONS

R. Gordon et al., "An N-Bus Datapath Compiler for IC Design", Silicon Compiler Systems Corp., 1989 IEEE, pp. 23.3.1-23.3.4.

* cited by examiner

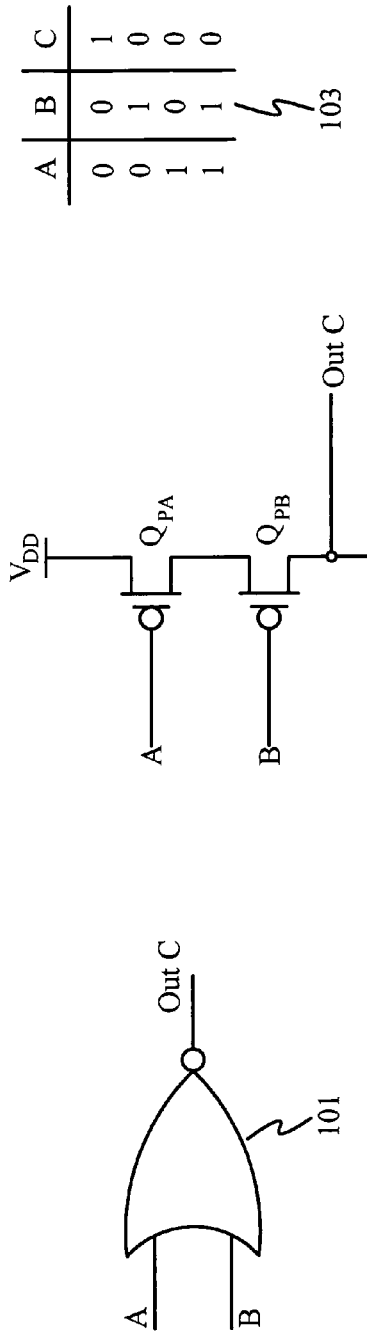
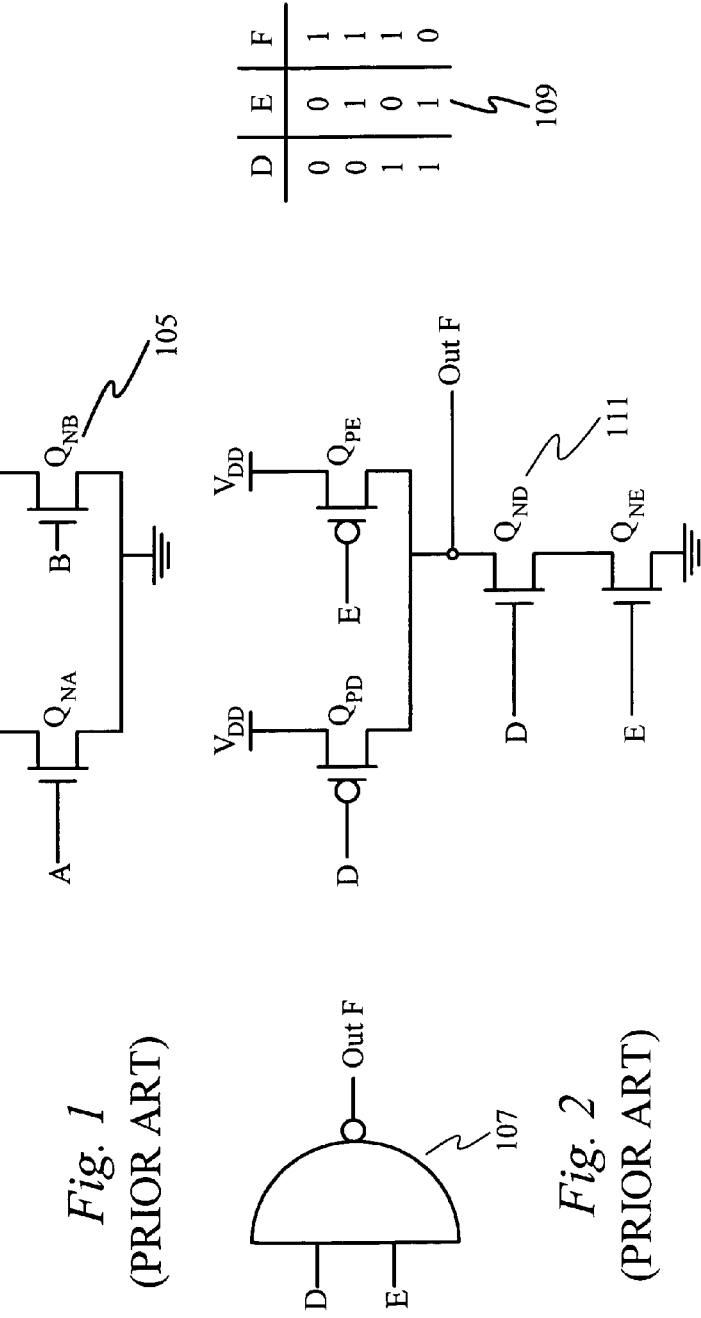
*Fig. 1* (PRIOR ART)
*Fig. 2* (PRIOR ART)

REDUCED ARCHITECTURE PROCESSING PATHS

RELATED APPLICATIONS

This patent application claims priority under 35 U.S.C. § 119(e) of the co-pending U.S. provisional application Ser. No. 60/458,910 filed on Mar. 28, 2003 and entitled "REDUCED ARCHITECTURE PROCESSING PATHS." The provisional application Ser. No. 60/458,910 filed on Mar. 28, 2003 and entitled "REDUCED ARCHITECTURE PROCESSING PATHS," is also hereby incorporated by reference.

FIELD OF THE INVENTION

The present invention relates to the field of integrated circuits. More particularly, the present invention relates to the field of replacing Boolean operators within an integrated circuit with reduced architecture equivalent circuits.

BACKGROUND OF THE INVENTION

Technology for designing and implementing integrated circuits continues to seek implementation of faster devices, while limiting the increase, or possibly even decreasing the size and power consumption of the integrated circuits. Throughout the many advances in speed and power consumption of integrated circuits, the design and implementation of such circuits has relied on "off the shelf" Boolean logic elements such as logical OR gates, NOR gates, AND gates, NAND gates, XOR gates, INVERTERS, etc.

CMOS circuits have been developed which implement the basic Boolean logic elements. These logic elements are referred to as basic elements. Logical Boolean functions are represented within integrated circuits by multi-transistor equivalent structures. When designing an integrated circuit, typically a designer will enter a program through an interface means such as a keyboard, using a known programming language. The program is translated into its equivalent basic Boolean elements by a compiler, including the connections between the outputs and inputs of various elements. Transistors comprising the integrated circuit are configured by the compiler to conform to this gating arrangement. Accordingly, Boolean logic is particularly amenable to implementation in computer systems. The process of designing and configuring an integrated circuit according to pre-determined transistor configurations is well known to those skilled in the art. FIGS. 1–4 illustrate common Boolean gates and the transistor equivalents currently used to represent these gates in a CMOS circuit.

FIG. 1 illustrates a logical NOR gate 101 as found in the prior art comprising inputs A and B, and output OutC, a truth table 103 corresponding to the logic of the NOR gate 101, and a four-transistor configuration 105 with inputs A and B and output OutC typically used in CMOS circuitry to reproduce the truth table 103 defining the input/output relationships generated the NOR gate 101.

FIG. 2 illustrates a logical NAND gate 107 as found in the prior art comprising inputs D and E, and output OutF, a truth table 109 corresponding to the logic of the NAND gate 107, and a four-transistor configuration 111 with inputs D and E and output OutF typically used in CMOS circuitry to reproduce the truth table 109 defining the input/output relationships generated by the NAND gate 107.

FIG. 3 illustrates a logical OR gate 113 as found in the prior art comprising inputs G and H, and output OutI, a truth table 115 corresponding to the logic of the OR gate, which is commonly configured from a four-transistor NOR gate 117 coupled with a two-transistor inverter 119. The output $Out_{(NOR)}$ of the NOR gate 117 is input into the gates of the P-channel and N-channel transistors of the inverter 119, and the state of the output OutI of the inverter behaves according to the states found in the truth table 115.

FIG. 4 illustrates a logical AND gate 121 as found in the prior art comprising inputs J and K, and output OutL, a truth table 123 corresponding to the logic of the AND gate, which is commonly configured from a four-transistor NAND gate 125 coupled with a two-transistor inverter 127. The output $Out_{(NAND)}$ of the NAND circuit 125 is input into the gates of the P-channel and N-channel transistors of the inverter 127, and the state of the output OutL of the inverter behaves according to the states found in the truth table 123.

Those skilled in the art will recognize that the AND and OR functions of FIGS. 3 and 4 may be equally simulated by inverting the respective outputs, as shown, or inverting both inputs (E and F) and (G and H) and inputting these inverted inputs into standard NAND and NOR gates respectively.

FIG. 5 illustrates a logical XOR ("Exclusive OR") circuit 135 and a truth table 137 disclosing the logical relationship of the inputs and outputs of an XOR function. As noted in the XOR circuit diagram 135, the inputs to the XOR circuit include M, N, and inverted forms $\overline{M}$ and $\overline{N}$. The total transistor count is therefore increased by the presence of inverter circuits 131, 133 to generate the inverted signals $\overline{M}$, $\overline{N}$.

Those skilled in the art will recognize that virtually all computer commands are reducible into discrete Boolean functions, and that Boolean algebra allows for the reduction of many complex Boolean functions into smaller and simpler Boolean expressions. Ideally, a computer programmer will reduce any complex Boolean function into the smallest and simplest representation. In conventional circuit design, these Boolean functions provide the basic elements forming sequences of logic functions. These Boolean functions are typically subdivided into one or more logical sequences which are configured on separate processing paths within an integrated circuit.

As illustrated in FIG. 6, a "logical sequence," refers to the sequence of Boolean logic elements between an input flip flop at the beginning of a processing path and an output flip flop at the end of the processing path. Typically, an integrated circuit includes a series of such processing paths. Depending on the integrated circuit, the number of separate processing paths may run from a single processing path to millions of separate processing paths. There is no upward limit on the number of possible paths.

Within the integrated circuit, Boolean functions within each path are executed, in a quasi-serial manner according to the logical elements comprising the data path. For example, the Boolean equation (R+S)·(T+U), as illustrated in the logical circuit of FIG. 7, performs the two OR functions 160, 162 simultaneously, and then subsequently inputs the results from the OR gates 160, 162 into an AND gate 164. Although the simultaneous operation of the OR operators 160, 162 illustrates that there may be parallel operations within a logical sequence of elements, in abstract block-type diagrams of FIG. 6, the processing paths are typically illustrated as exclusively serial functions. Those skilled in the art will therefore understand that, as used herein, terms such as "serial" or "sequence of elements" and equivalent terms describing the architecture and behavior of a single processing path are intended to incorporate both the parallel and serial functionality.

Within the sequence of elements illustrated in FIG. 6, an input flip flop 138 is located at the start of a processing path, and an output flip flop 139 is located at the end of the processing path. The various elements 141–151 along the processing path represent logic elements or gating functions as illustrated in FIGS. 1–5 above, disposed in the data path between the input flip flop 138 and the output flip-flop 139. The flip-flops 138, 139 are used to hold the state of the last calculation and only transition on a clock pulse, typically the leading edge of the pulse. The logic elements 141–151, however, produce an output that reflects the "last state" of the inputs, even if an input changes state in the middle of a clock cycle. Accordingly, the logic elements within a processing path are therefore able to change state and advance logic between clock pulses. As discussed in conjunction with FIG. 7 above, this gives rise to the "quasi-serial" nature of a data path. As noted, the AND operation 164 can only take place after the two OR operations 160, 162 have been completed. If inputs into an element 164 arrive non-simultaneously, the output state of an element may change several times in a single clock pulse. Signal transmission along the processing path, however, including all intermediary state changes, must be completed before the final states are recorded in the output flip flop 139. Because the logic of a data path must be completed and the output flip flop 139 must be set within the period of a single clock pulse, it is essential that the time needed to execute a logic path between an input flip flop 138 and an output flip flop 139 is not greater than the period of a single clock pulse. The clock speed of a chip, and consequently its performance, is therefore limited by the speed at which a pulse travels from the input flip-flop 138 through the sequence of logic elements 141–151 and records the output value in the output flip-flop 139. A 200 MHz chip allows 4 nano seconds (4000 pico seconds) per logic path between clock cycles. As seen in FIG. 6, the time for a signal to completely traverse a flip-flop is represented by $t_1$, which is typically on the order of 400 pico seconds in current designs. The time to traverse a basic logic element is represented by $t_2$. For a four-transistor element, the time to traverse a basic logic element is typically on the order of 150 pico seconds in 130 nanometer manufacturing processes. The transmission time between elements, represented by $t_3$, is typically on the order of 50 pico seconds in current designs. These time delays are not fixed, and will vary according to present and future design manufacturing processes and architectures. The specific time delays listed herein are therefore offered simply for exemplary purposes to illustrate more clearly the principles set forth in the present invention.

A data path operating at these conventional speeds may sustain up to sixteen logic elements between the input flip flop 138 and the output flip-flop 139 and remain within the 4 nano second clock cycle. These time delays are exemplary however, and in actual practice, current integrated circuits are typically configured with an upper limit of twenty logic elements per path. It is anticipated that new designs are going to increase above this to twenty-two elements.

CMOS architecture advantageously utilizes P-channel transistors for pull-up, and N-channel transistors for pull down functions. Accordingly, a single input inverter ("NOT") 131, as illustrated in FIG. 5, is seen to require two transistors. A two-input NAND gate 111, as illustrated in FIG. 2 and a NOR gate 105, as illustrated in FIG. 1, each require a four transistor structure. A two-input AND gate 121 as illustrated in FIG. 4 and an OR gate 113 as illustrated in FIG. 3, require six transistors. FIG. 5 illustrates a two-input XOR gate 135 that requires twelve transistors including the inverters 131, 133. Because the application and use of these Boolean elements are fixed in integrated circuit architecture, the delays associated with these elements are also fixed. Additionally, chip size and power consumption are largely proportional to the number of transistors in a chip. Targeted objectives in CMOS circuit design typically include the achievement of higher speed, smaller size and lower power consumption. What is needed therefore is a method and apparatus for decreasing the total time for a signal to traverse a processing path in a MOS circuit. There further exists a need for a method and apparatus for reducing the size of a MOS circuit. Additionally, the need exists for a method and apparatus for reducing the power consumed by a CMOS circuit.

SUMMARY OF THE INVENTION

The present invention is directed to a method and apparatus for decreasing the total time for a signal to traverse a processing path in a MOS circuit. The present invention is also directed to a method and apparatus for reducing the size of a CMOS chip. Additionally, the present invention is directed to a method and apparatus for reducing the power consumed by a CMOS chip.

A method of designing an integrated circuit comprises programming a processing path within the integrated circuit according to a first substitute circuit. The first substitute circuit comprises substitute inputs and a substitute output, such that a truth table representing the first substitute circuit is identical to a truth table representing a first sequence of Boolean elements representing a processing path. The first substitute circuit is not definable by a sequence of basic Boolean circuits. According to one embodiment, the first substitute circuit is generated by a circuit generation module. According to one embodiment, the first sequence of Boolean elements is reduced into at least one intermediate equivalent circuit prior to the step of generating a first substitute circuit. According to one embodiment, the step of programming is preceded by the steps of generating a plurality of sequences of basic Boolean elements respectively defined by a plurality of truth tables, generating a respective plurality of substitute circuits not definable by a sequence of basic Boolean elements, including the first substitute circuit, wherein a sequence of basic Boolean elements and its respective substitute circuit are defined by a same truth table, storing the plurality of sequences of basic Boolean elements in a library, storing the plurality of substitute circuits in the library in a relationship corresponding to their respective sequence of basic Boolean elements, receiving a first sequence of basic Boolean elements, and searching the library for the first substitute circuit. According to one embodiment, if the first sequence of basic Boolean elements is not found within the library, a first substitute circuit is generated corresponding to the first sequence of basic Boolean elements. The first substitute circuit is added to the library. According to an embodiment, the library comprises a digital memory.

An apparatus for reducing a throughput time of a processing path of basic logic elements within an integrated circuit, the apparatus comprising a programming module for programming a first substitute circuit into the processing path of the integrated circuit, wherein the substitute circuit is not defined by a sequence of basic Boolean circuits and, wherein the substitute circuit is defined by a truth table identical to a truth table defining a processing path comprised of basic Boolean circuits. The apparatus further comprising a circuit generation module configured to analyze a sequence of basic Boolean elements and generate a complimentary substitute circuit. According to an embodiment, the processing path comprises an input tip flop. According to an embodiment, the integrated circuit is an NMOS circuit. In an embodiment or the present invention, the apparatus further comprises a sequence generator for generating a plurality of sequences of Boolean elements, wherein the circuit generation module is configured to generate a complimentary substitute circuit for each sequence of Boolean elements generated, a library for storing the plurality of sequences of Boolean elements such that each Boolean element is stored in a correlation to its complimentary substitute circuit, a search module for searching the library for a first sequence of Boolean elements, and a retrieval module for retrieving a substitute circuit from the library. In an embodiment, the library comprises a digital medium.

A method of programming a processing path comprising an input flip flop in a MOS integrated circuit comprises receiving a first sequence of basic Boolean elements, reducing the first sequence of basic Boolean elements to an equivalent sequence of elements, generating a substitute circuit from the equivalent sequence of elements, programming a processing path in the NMOS integrated circuit according to the substitute circuit, wherein the substitute circuit is not definable by a sequence of basic Boolean elements, and wherein the substitute circuit is generated to define a truth table that also defines the first sequence of Boolean elements.

BRIEF DESCRIPTION OF THE DRAWINGS

FIG. 1 illustrates a logical representation, a transistor schematic and truth table for a NOR gate.

FIG. 2 illustrates a logical representation, a transistor schematic and truth table for a NAND gate.

DETAILED DESCRIPTION OF A PREFERRED EMBODIMENT

Reference will now be made to the various embodiments of the present invention.

Figure 3:
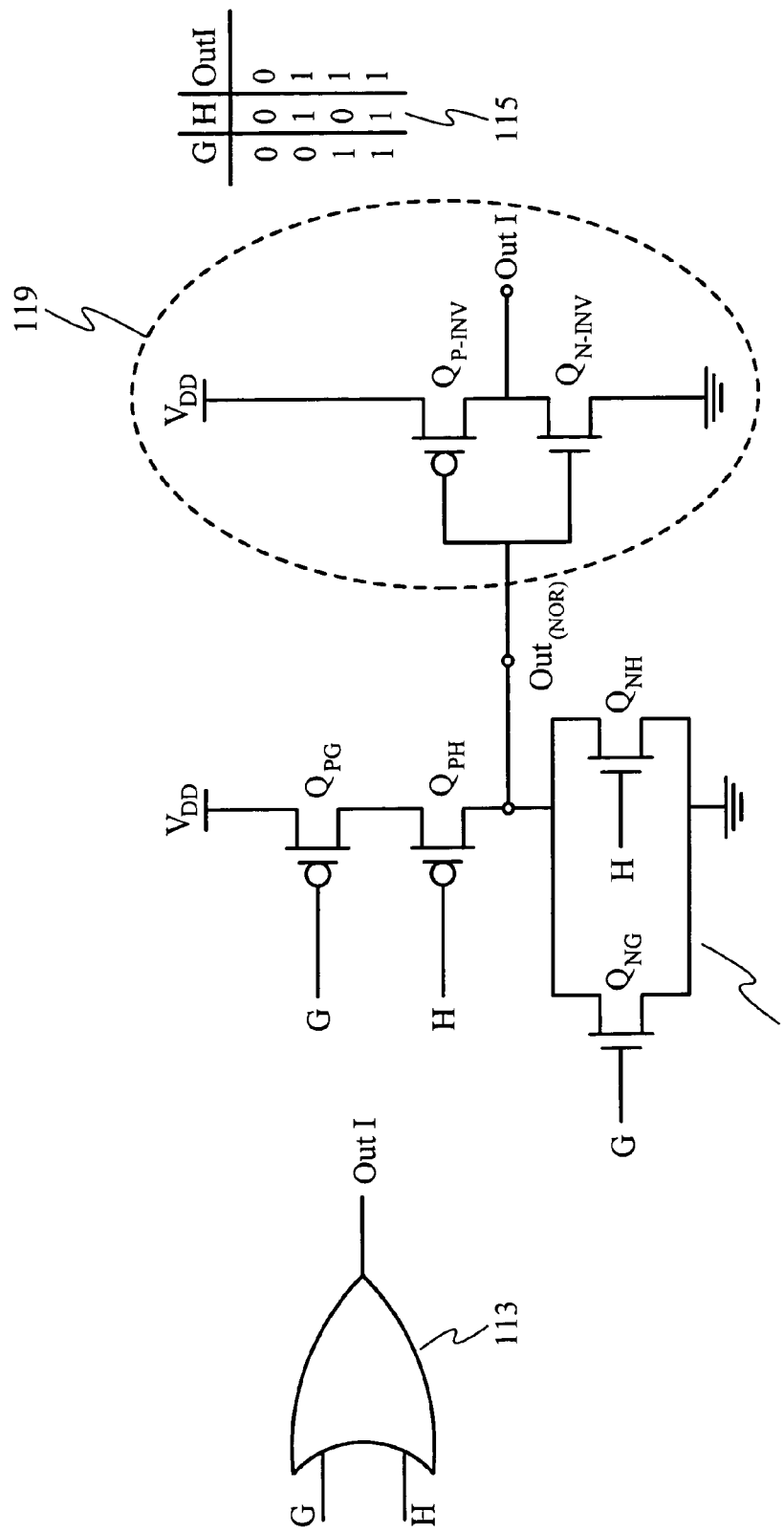
FIG. 3 illustrates a logical representation, a transistor schematic and truth table for an OR gate.
Figure 4:
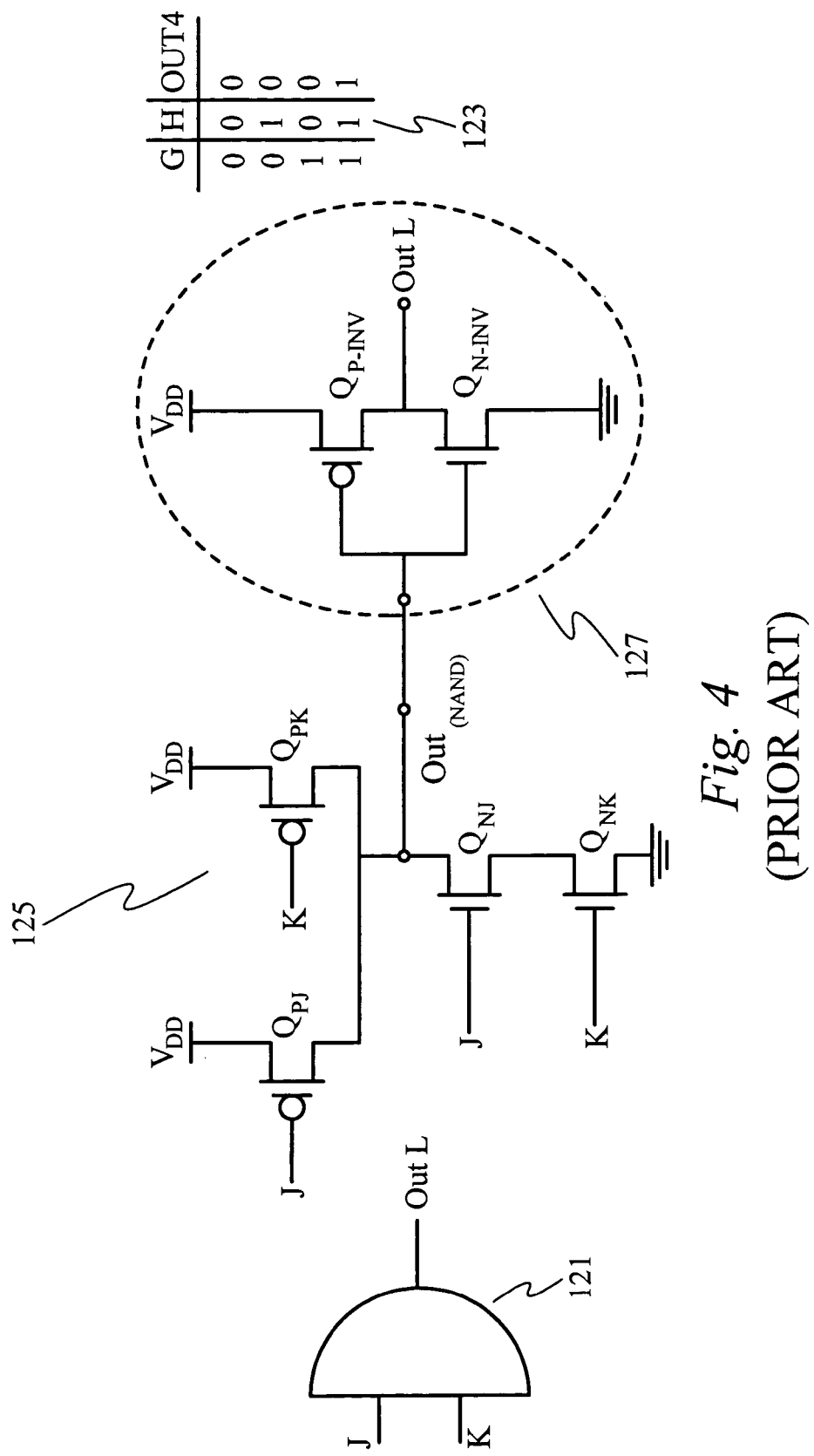
FIG. 4 illustrates a logical representation, a transistor schematic and truth table for an AND gate.
Figure 5:
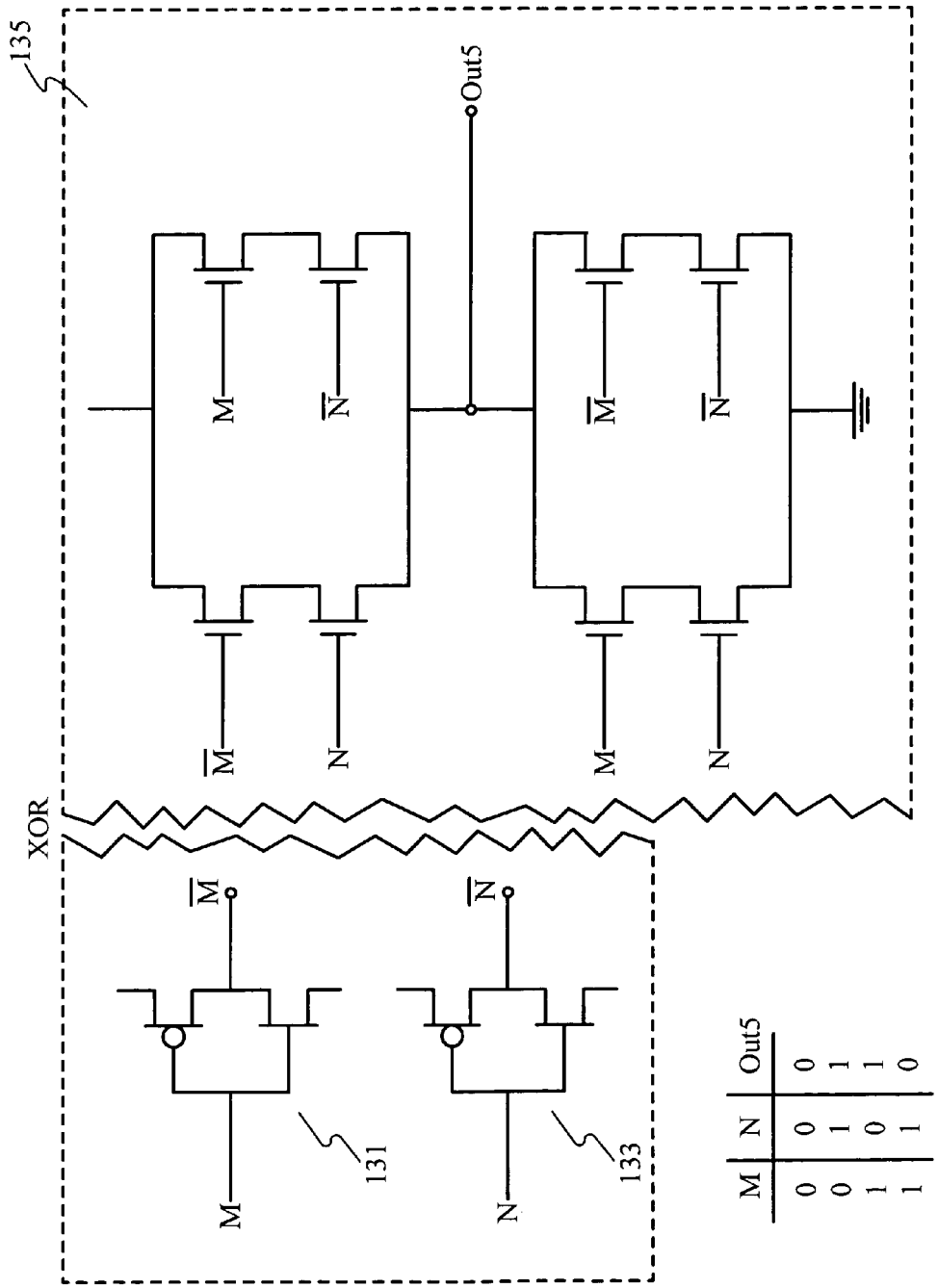
FIG. 5 illustrates a transistor schematic and truth table for an XOR gate.
Figure 6:
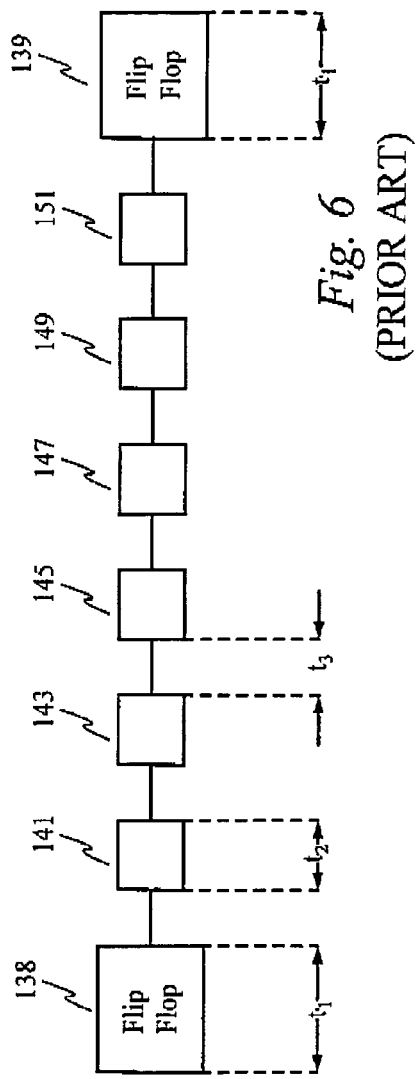
FIG. 6 illustrates a processing path between an input flip flop and an output flip flop, including time delays.
Figure 7:
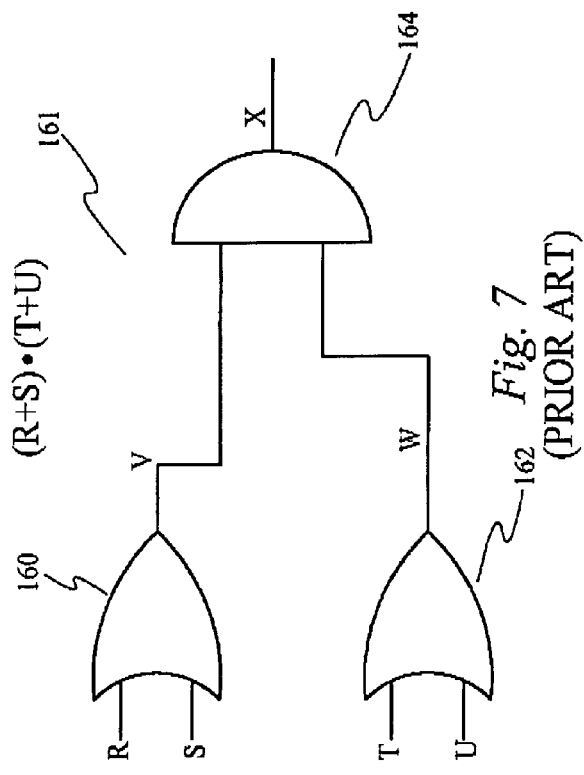
FIG. 7 illustrates a logical structure comprising three basic Boolean logic elements.
Figure 8:
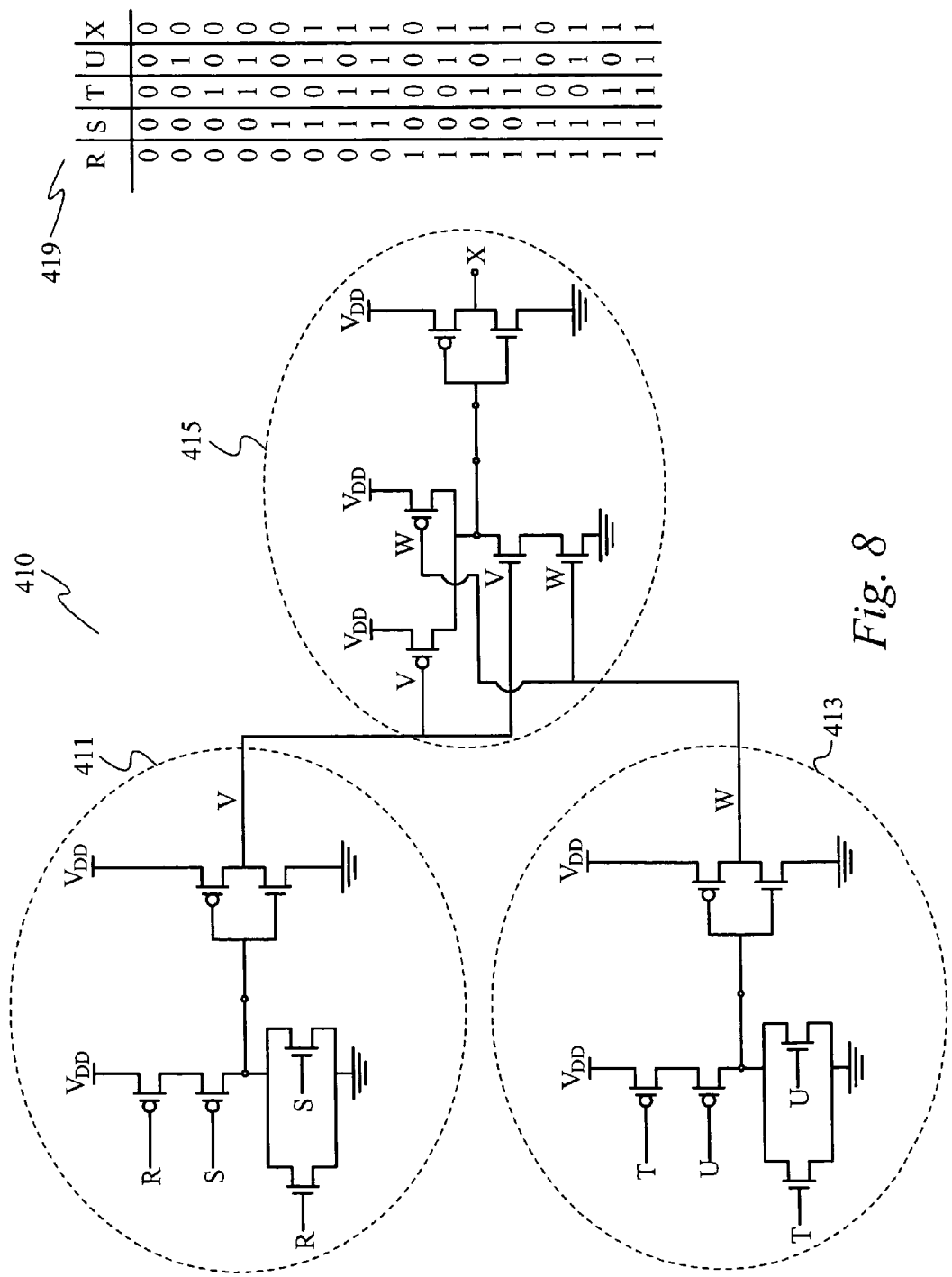
FIG. 8 illustrates a basic Boolean-equivalent transistor circuit performing the logic of FIG. 7, and a truth table.

FIG. 8 illustrates a transistor circuit 410 configured to perform the identical logic function of the Boolean circuit 161 of FIG. 7. Transistor circuit 411 is an off-the-shelf transistor circuit or "basic Boolean circuit" for the OR gate 160 of FIG. 7. Transistor circuit 413 is the basic Boolean circuit for the OR gate 162 of FIG. 7. Transistor circuit 415 is the basic Boolean circuit for the AND gate 164 of FIG. 7. The outputs V and W of the transistor circuits 411 and 413 respectively form the inputs to the transistor circuit 415. The basic Boolean circuits 411, 413 and 415 are therefore electrical schematic circuits of the basic Boolean logic gates, and perform the identical function of their respective corresponding Boolean logic gates, 160, 162 and 164. Therefore, the sequence of element-level Boolean circuits 411, 413 and 415 respectively perform the same collective operation as the sequence of Boolean logic gates 160, 162, 164 of FIG. 7. Accordingly, the truth table 419 defining the relationships of inputs and outputs among the basic-Boolean-circuit sequence 410 is the same truth table defining the relationships of the inputs and outputs of the Boolean gate sequence 161 of FIG. 7. The circuit 410 of FIG. 8, which is comprised of off-the-shelf Boolean equivalent logic circuits 411, 413 and 415 is seen to comprise eighteen transistors.

Figure 9:
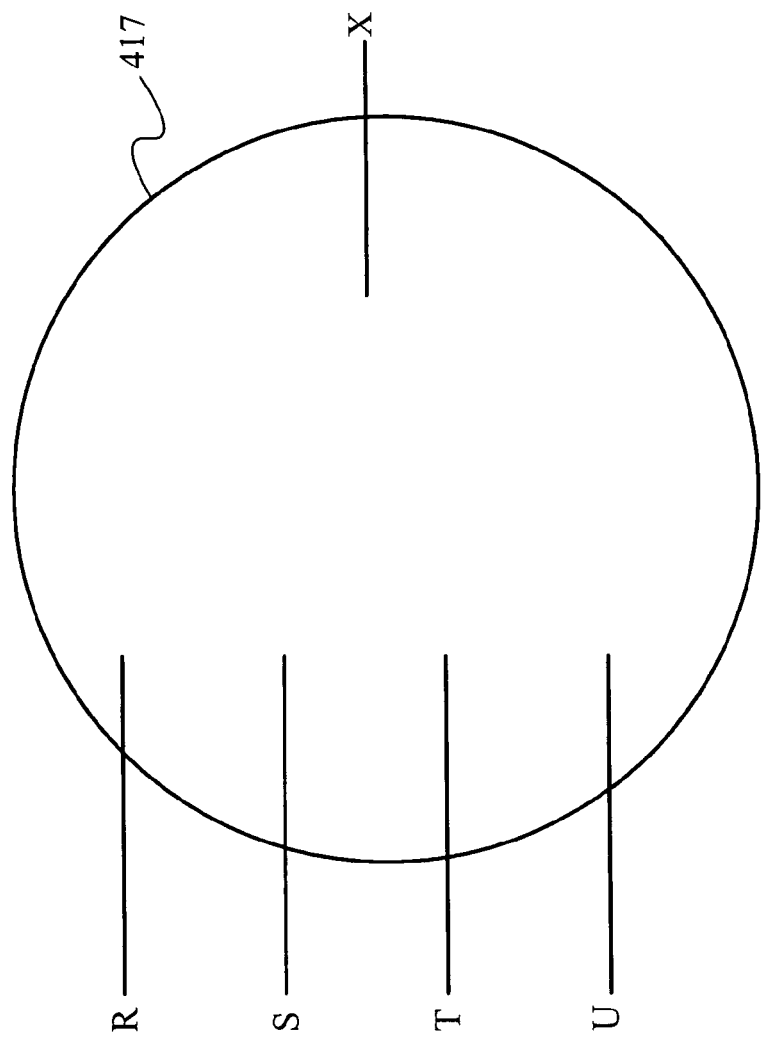
FIG. 9 illustrates a reduced transistor non-Boolean equivalent circuit performing the logic of FIG. 7, and a truth table.

FIG. 9 is a reduced-transistor substitute circuit 417 according to the present invention, representing the transistor circuit 410 of FIG. 8. In contrast to the circuit 410 of FIG. 8, the reduced-transistor equivalent circuit 417 of FIG. 9 comprises less transistors. Because the reduced-transistor equivalent circuit 417 of FIG. 9 comprises fewer transistors than the Boolean-equivalent circuit 410 of FIG. 8, it is faster, and consumes less power. The reduced-transistor equivalent circuit 417 is complementary to the Boolean gate sequence 161 and the basic-Boolean-circuit sequence 410 in that it is configured to produce the same truth table 419 that defined the binary relationship between inputs R, S, T, and U, and output X in Boolean gate sequence 161 and the basic-Boolean-circuit sequence 410. Accordingly, a processing path comprising circuit 417 may be substituted for a processing path comprising circuit 410. An important feature, however, of the reduced-transistor circuit 417, is that it is not made from a sequence of off-the-shelf Boolean circuits. It duplicates the overall function of the logic circuit 161, but can not be divided into component portions that duplicate each of the component logic gates 160, 162 and 164. It is therefore not definable by a sequence of Boolean logic circuits.

As discussed above, a first advantage of using a reduced-transistor equivalent circuit such as the circuit 417 in an integrated circuit is the reduced throughput time. Depending on the Boolean circuit being reduced, a reduced-transistor circuit can typically be expected to reduce the throughput time proportional to the reduction of true serial operations.

Figure 10:
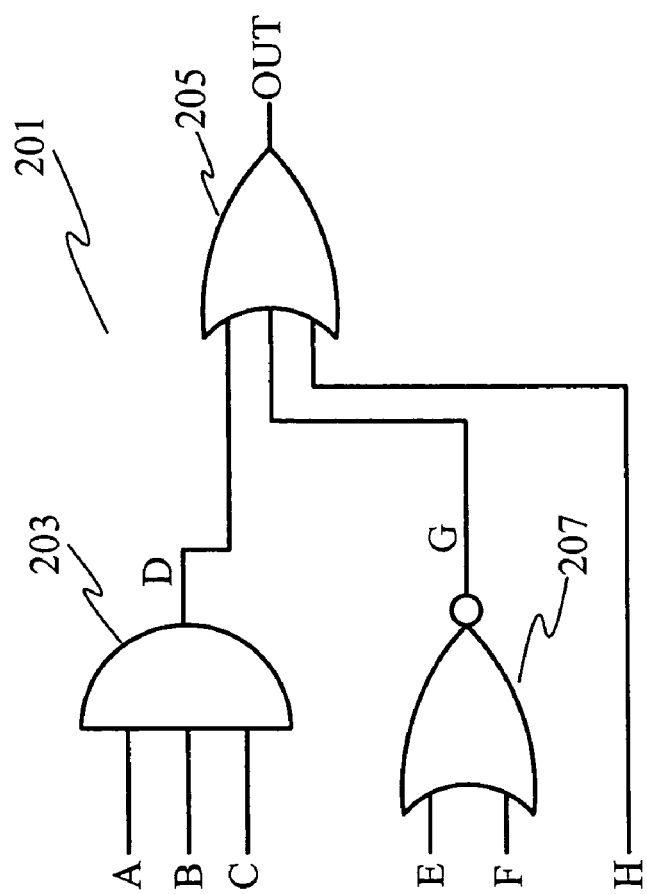
FIG. 10 illustrates a logic circuit combining two and three-input basic Boolean logic elements, and a truth table.

Embodiments of logical functions such as AND and OR gates are often utilized which comprise more than two inputs. FIG. 10 illustrates a logical gating sequence 201 wherein the AND gate 203 and the OR gate 205 comprise more than two inputs. Boolean logic elements 203 and 205 comprising more than two inputs can also be configured from Boolean equivalent transistor circuits. A further object of the present invention therefore involves substituting a reduced-transistor equivalent circuit for processing paths designed for Boolean elements comprising more than two inputs.

Figure 11:
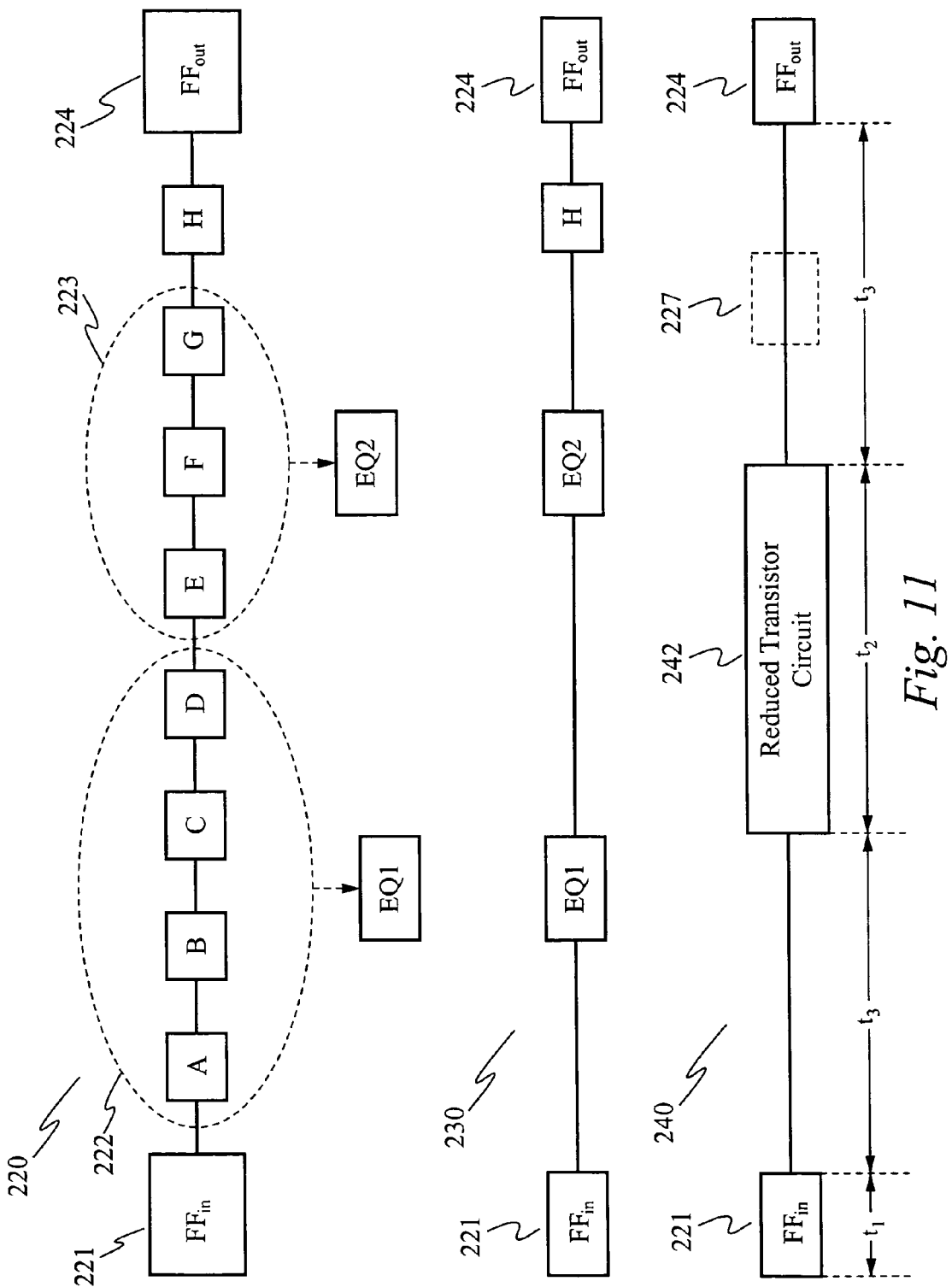
FIG. 11 illustrates a conceptual reduction of a processing path from a sequence of Boolean logic elements to a reduced sequence of equivalent elements to a final reduced transistor circuit.
Figure 12:
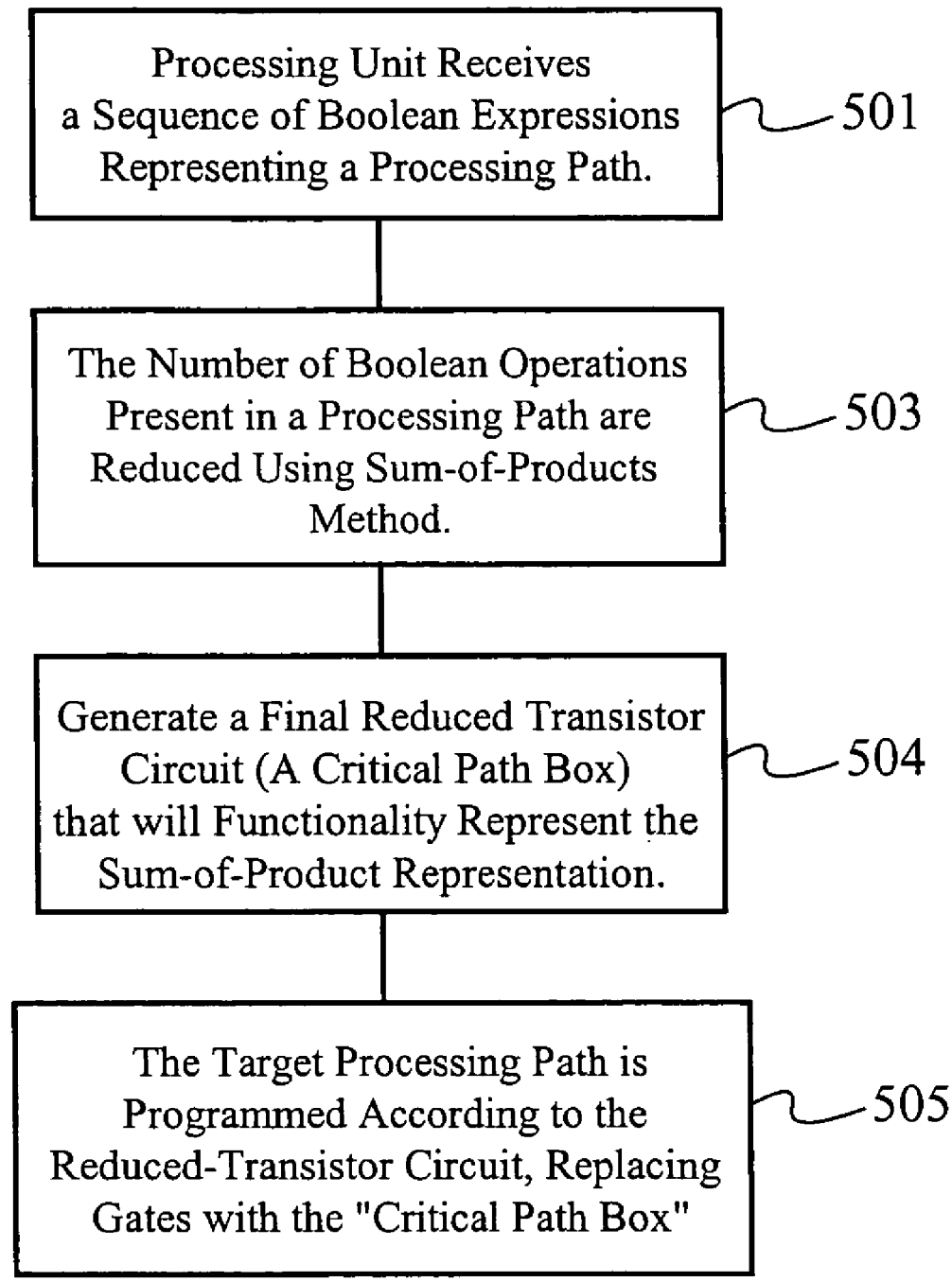
FIG. 12 illustrates a flow chart of a process for generating a processing path of reduced-transistor logic within an integrated circuit.

FIG. 11 illustrates an original processing path 220 in various stages of elemental reduction. FIG. 11 is described in conjunction with the direct-programming embodiment described in FIG. 12. In the step 501 of FIG. 12, a processing unit receives a sequence of Boolean expressions representing a processing path. If programmed in that form, the sequence of Boolean expressions would form the original processing path 220 in FIG. 11, comprising a sequence of basic Boolean circuit elements A, B, C, D, E, F, G and H disposed along the processing path between the input flip-flop $FF_{in}$ 221, and the output flip-flop $FF_{out}$ 224. In the step 503 of FIG. 12, the number of Boolean operations present in the original processing path 220 are reduced according to at least one method from a variety of methods. According to one embodiment, the "sum-of-parts" method, a technique well known to those skilled in the art, is used for constructing the equivalent circuits EQ1 and EQ2. According to another embodiment, equivalent circuits EQ1 and EQ2 are constructed by reducing the part of the original circuit path through well known principles of Boolean algebra. An advantage of the sum-of-parts method is that it typically produces a greater measure of parallelism in circuit structures than the amount of parallelism generated by Boolean reduction. Those skilled in the art will understand that greater parallelism will often translate to faster throughput along a processing path. However, as illustrated by the sequential reduction of the original processing path 220 through an intermediate processing path 230 to the final processing path 240 of FIG. 11, the intermediate processing path 230 is not the final embodiment of the circuit path. Because the intermediate circuit path 230 does not represent the final structure that will be implemented within the critical path box 242, the parallelism and increased circuit speed of the sum-of-parts method is not realized in the formation of intermediate circuits EQ1 and EQ2 of the intermediate circuit path 230. For this reason, alternative embodiments are envisioned including reduction through Boolean algebra as mentioned above, or other methods which are known or will be discovered in the future. The immediate goal in the development of equivalent circuits EQ1 and EQ2 is not circuit speed or other functional considerations, but the generation of equivalent circuits which provide for the most effective reduction to the final reduced transistor circuit 242 or the final circuit path 240. The importance of speed in equivalent circuits EQ1 and EQ2 is limited largely to those embodiments wherein the processing path 230 cannot be further reduced to the processing path 240. The result of the step 503 of FIG. 12 is illustrated in processing path 230 of FIG. 11, wherein the processing path 220 has been reduced to an intermediate processing path 230 comprising equivalent circuits, EQ1, EQ2 and the original basic circuit H. The presence of the original basic circuit H in the intermediate processing path 230 illustrates that sum-of-parts circuit reduction, or Boolean circuit reduction do not have to fully reduce all component circuits A–H, to apply the principles of the present invention.

Although embodiments are envisioned wherein the intermediate path 230 of Boolean or sum-of-products circuits are not reducible any further, and represents the final embodiment of the circuit that will be programmed into a physical circuit, according to the step 504, the preferred embodiment envisions that a reduced-transistor circuit or "critical path box" 242 is generated from a circuit generation module into a circuit representation that cannot be represented exclusively by sum-of-products elements, as equivalent circuits EQ1 and EQ2 were. Regardless of the number of intermediate steps, or lack thereof, each intermediate path and the final reduced-transistor circuit 242 are constructed to define a truth table identical to the original processing path 220. The processing path 240 of the final reduction will therefore perform identically as the processing paths 230 and 220. In the step 505 of the direct programming embodiment, the target processing path 240 is programmed according to the reduced-transistor circuit 242. As discussed herein, however, the sequence of Boolean expressions of step 501 can be stored on a storage media following the step 504 until an entire reduced transistor program is assembled on a storage media. The entire reduced transistor program can then be downloaded into a circuit according to the step 505.

Embodiments are envisioned wherein a single reduced transistor circuit 242 will not, by itself, be able to duplicate the functionality of the original processor path 220. In such cases, the remainder circuit 227 illustrated by the dotted box on the final circuit path 240 illustrates additional element(s) in the final processing path. Accordingly, total path reduction into a single critical path box 242 is optimal, but does not have to occur for the present invention to be implemented. However, because each circuit functions as an integrated whole, the final circuit path 240 can alternatively be thought of as comprising a single critical path box 242 comprising non-Boolean circuit equivalents, as well as Boolean or sum-of-parts circuitry such as represented by the remainder circuit 227, only integrated into the reduced transistor circuit 242. The remainder circuit 227 of FIG. 11 is therefore illustrated primarily for conceptual purposes.

The remainder circuit 227 can be an equivalent circuit such as EQ2 in a sum-of-products or Boolean format, an original basic Boolean circuit H, or even another reduced transistor circuit that cannot be represented simply by sum-of-parts or Boolean algebra. A truth table representing the final processing path 240 duplicates the truth table of the original processing path 220. According to the preferred embodiment therefore, wherein the original processing path 220 is fully reducible down to a single reduced transistor circuit 242, the input/output truth table representing the reduced transistor circuit 242 will be identical to the input/output truth table of the original processing path 220, which was identical to the intermediate processing path 230.

According to the above discussion, it is understood that the presence of the intermediate path 230 in FIG. 11 and the corollary step 503 of FIG. 12 is illustrative only. Reduction of a circuit from the original path 220 to the final processing path 240 may have no intermediate steps such as that represented by intermediate circuit path 230, or multiple intermediate paths. Moreover, the output flip flop $F_{OUT}$ 224 is only one potential output within the processing path. It is shown as the end of circuit paths 220, 230 and 240 in FIG. 11 for illustrative purposes since it constitutes a commonly found path terminus. The present invention is applicable for any circuit path utilizing any path terminus member.

Figure 13:
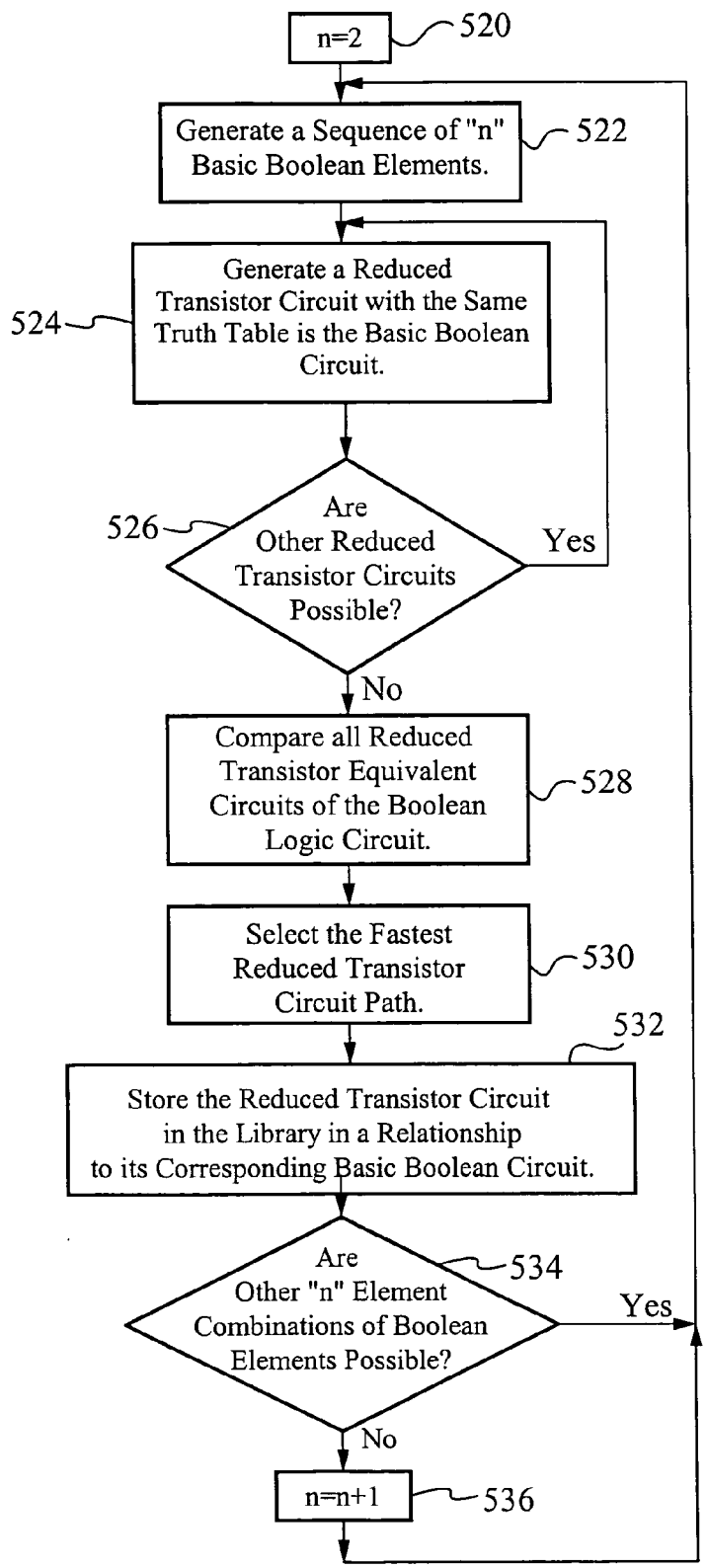
FIG. 13 illustrates a flow chart of a process for generating a library of non-Boolean reduced transistor circuits equivalent to various Boolean sequences.
Figure 14:
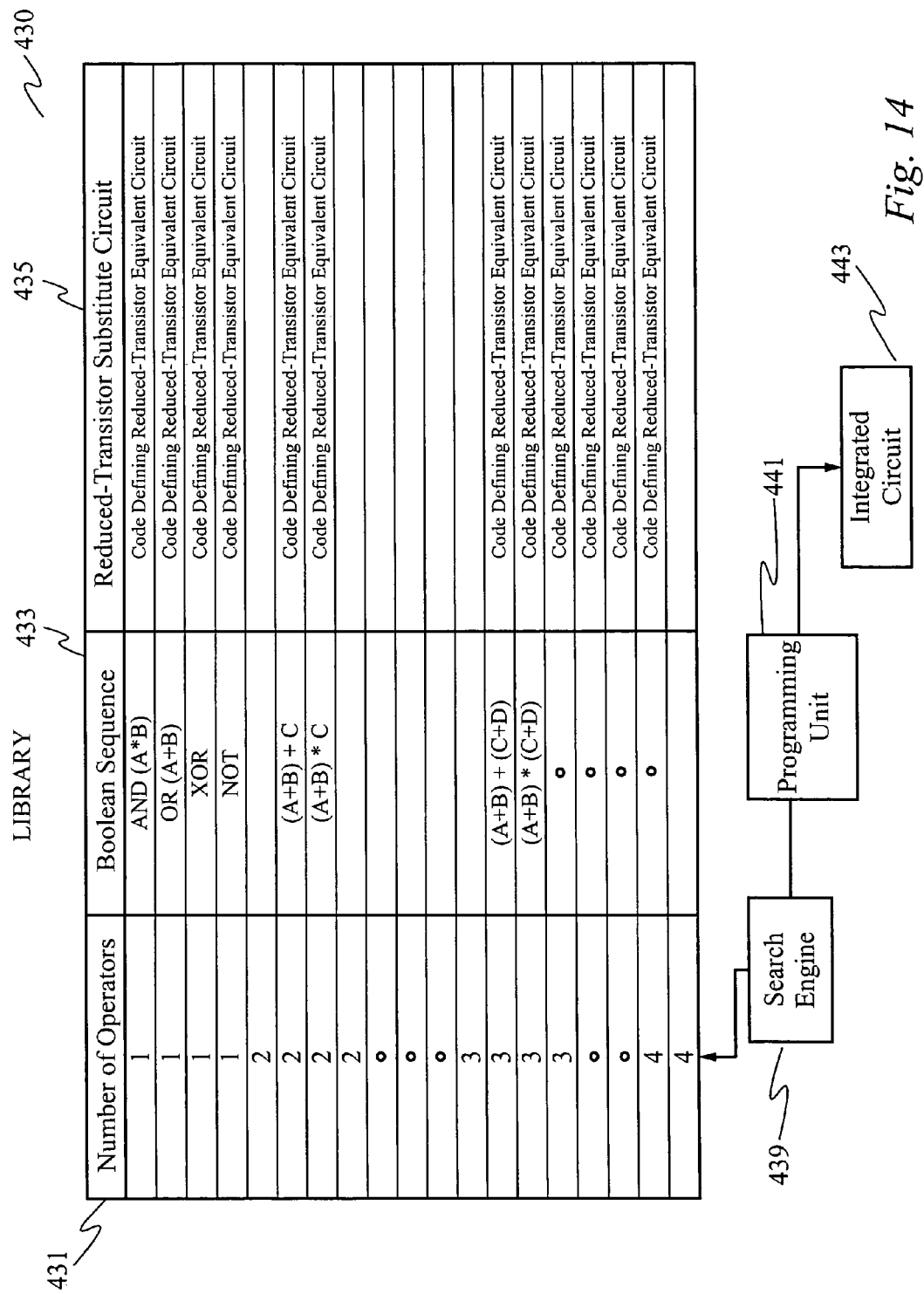
FIG. 14 illustrates a library of basic Boolean sequences correlated to reduced-transistor equivalent circuits.

FIG. 12 discussed above describes the direct programming embodiment wherein a sequence of Boolean expressions is received, the equivalent circuit 242 is generated, and the equivalent circuit 242 is programmed directly into a functional circuit. In another embodiment, the systematic library embodiment, a library of "off the shelf" equivalent circuits are generated in advance, as illustrated in FIG. 13. An illustration of a library is shown in FIG. 14. According to the step 520, n is set to n=2. In the step 522, a digital process generates a Boolean logic circuit comprising n basic Boolean operations. According to the step 524, a reduced-transistor circuit is generated which produces a truth table identical to the basic Boolean circuit of the step 522. The reduced transistor circuit is produced in a manner described in the steps 503 and 504 of FIG. 12, and as illustrated in FIG. 11. In the step 526 of FIG. 13, a computer type device determines if there are other possible reduced transistor equivalent circuits for the Boolean circuit of step 522. If other possible reduced-transistor circuits are possible, the computer continues to generate these circuits until all possible combinations are generated. If it is mathematically unworkable to determine if every possible reduced-transistor circuit has been generated, as an alternative, the process envisions producing a sufficient number of reduced-transistor circuits to allow for comparison according to the step 528. In the step 528, the various reduced-transistor circuits are analyzed to determine which has the fastest processing path. In the step 530, the reduced-transistor circuit exhibiting the fastest processing path is selected and in the step 532, the selected reduced-transistor circuit is stored in the library in an orientation corresponding to the Boolean logic circuit of the step 522. The relationship of Boolean sequences and reduced transistor substitute circuits is discussed in greater detail in conjunction with FIG. 14. According to the step 534 of FIG. 13, the computer generating the library determines if there are other possible n element combinations of basic Boolean operations. If there are, the process returns to the step 522, and generates a new Boolean logic circuit. For example, in a two element circuit, the first sequence generated in the step 522 could have been a first two-input AND gate with a first output forming an input of a second two-input AND gate. After generating a reduced transistor combination logic circuit according to the step 524, and advancing to the step 534, the processor determines that there is at least one other two-element circuit, a first two-input AND gate with a first output forming an input of a first two-input OR gate. According to FIG. 13, the process will loop to the step 522 and continue. If, in the step 534, there are no more possible combinations of n basic Boolean operations, in the step 536, the value n is incremented to n+1, and the process returns to the step 522. The process disclosed in FIG. 13 will terminate as the result of a variety of triggers. One trigger for terminating the process is when a library reaches a maximum practical size for mass storage and access. Alternatively, the process according to FIG. 13 will terminate when n reaches a predetermined number. According to the preferred embodiment, the value of n used to terminate the operation will be equal to the maximum number of Boolean operations occurring in a processing path according to current industry standards.

FIG. 14 illustrates one embodiment of a library 430 comprising a variety of Boolean sequences 433 and programming descriptions of their equivalent (reduced-transistor) circuits 435. According to the preferred embodiment, the library is a digital medium for storing information. To facilitate rapid searching, the library is advantageously organized according to the number of Boolean operations 431 in a sequence for which an equivalent circuit is sought. According to the preferred embodiment, the reduced-transistor circuit corresponding to a Boolean sequence is stored in the form of a code that can easily be processed to program the reduced-transistor circuit into the processing path of an integrated circuit. A programmer accesses the library through a search engine 439. The programmer enters a sequence of Boolean operations which define a programming path to be programmed in an integrated circuit. When the search engine 439 locates the Boolean sequence 433 within the library, the code 435 defining the equivalent circuit is downloaded from the library 430 to a programming unit which then functions to program the reduced-transistor circuit into the processing path of the target integrated circuit 443.

Figure 15:
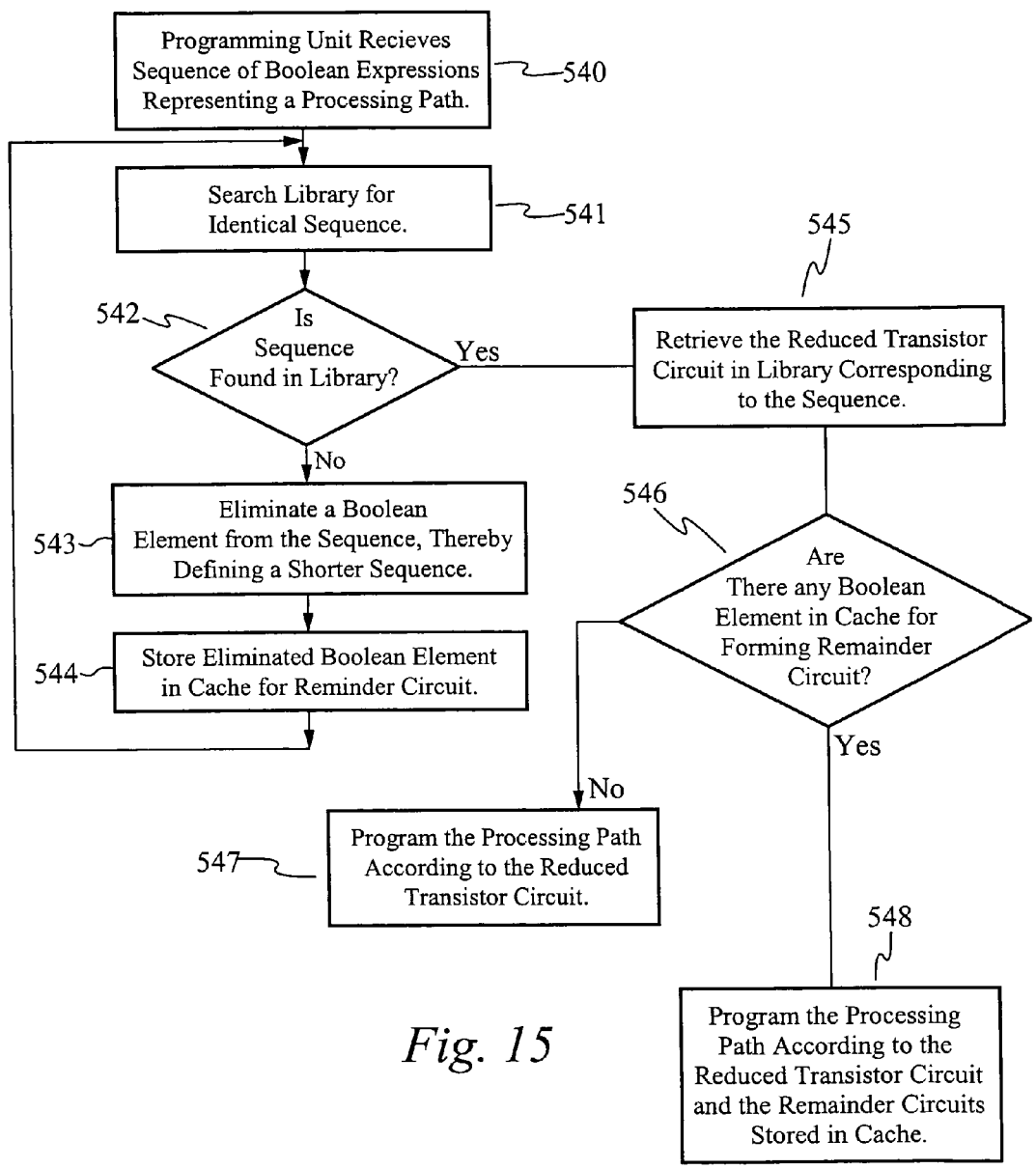
FIG. 15 is a flow chart illustrating one process for using a library that is not exhaustive.

The flow chart disclosed in FIG. 15 illustrates a process for programming a circuit path from a library of pre-calculated reduced transistor circuits. In the step 540, the programming unit receives a sequence of Boolean expressions representing a processing path. In the step 541, a search engine searches the library for the identical sequence. In the step 542, if the sequence is not found in the library, the process eliminates a boolean element from the sequence according to the step 543, thereby defining a shorter sequence. In the step 544, the eliminated sequence is stored in a cache for forming a remainder circuit, or a plurality of remainder circuits. The process returns to the step 541 and searches the library for the reduced sequence. In the step 542, if a sequence is found in the library, the processor retrieves the reduced transistor circuit stored in the library in conjunction with the sequence. In the step 546, if there are no Boolean elements in the cache, a processing path is programmed in the step 547 according to the reduced transistor circuit retrieved from the library. In the step 546, if any Boolean elements are stored in the cache, a remainder circuit(s) is formed, and the processing path is programmed according to the reduced transistor circuit and the remainder circuits stored in the cache. The circuit library method of FIG. 13 is one alternative to the direct programming embodiment of FIG. 12. Embodiments are envisioned, however, wherein the library embodiment and the direct programming embodiment are used in a complimentary fashion in the programming of a plurality of processing paths in an integrated circuit.

The respective advantages of the direct programming embodiment utilizing a circuit generation module configured to generate and program an equivalent circuit after a Boolean expression is received, and the embodiment utilizing a circuit library hinge largely around the issues of speed and storage space. If the process of generating an equivalent reduced-transistor circuit is unworkably slow, the process of programming an integrated circuit may be impractical, and an application may be better served by utilizing the circuit library embodiment. However, a library is limited by the storage capacity of a given storage device. Moreover, the greater a memory capacity, the more time is typically required to access a given storage location and retrieve data. The longer a sequence of logical elements becomes, the greater the number of combinations and permutations of Boolean sequences are possible within the processing path. The exponential nature of this problem can be illustrated by limiting consideration to just two logical functions, the AND logic function and the OR logic function. According to this limitation, there are two possible sequences for a single logic gate, (A·B) and (A+B). However, when the number of gates in a sequence is increased from one to three, there are fourteen possible sequences of AND gates and OR gates. This rapid increase in the number of possible Boolean sequences gives some indication of the exponential number of possible sequences in processing paths of ten, fifteen or twenty Boolean elements. Moreover, the above example was restricted to only two-input Boolean gates, and was further restricted to only the AND and OR operations. Those skilled in the art will readily see that the use of two and three input gates, including NOR, OR, XOR, NOT, AND and NAND gates will vastly increase the exponential rate at which the number of possible sequences rises with an increase of elements in the sequence. Depending on the storage technology used, this exponential growth in possible sequences of Boolean operations may limit the usefulness of the library embodiment.

As discussed above, the storage limitations of the library embodiment must be weighed against the speed limitations of the circuit generation module embodiment in determining whether it is preferable to generate reduced-transistor equivalent circuits on demand, or to develop a library of equivalent circuits ahead of time. By preparing a library in advance, the time required to construct a reduced-transistor circuit is eliminated, and the programming delay is reduced to the time required to search for a Boolean combination within the library and retrieve the reduced-transistor equivalent circuit. If the retrieval process is faster than the circuit fabrication process, programming becomes more efficient. As noted, however, a factor weighing against the generation of a comprehensive library is that, as the number of elements along a processing path increases, the possible combinations and permutations of basic Boolean operations increases exponentially, and the storage of so many logic combinations may be prohibitive. Because both the capacity of mass-storage devices, and processing speeds and techniques are continually improving, the relative weights of these conflicting factors will depend on the state of technology at any given time.

Figure 16:
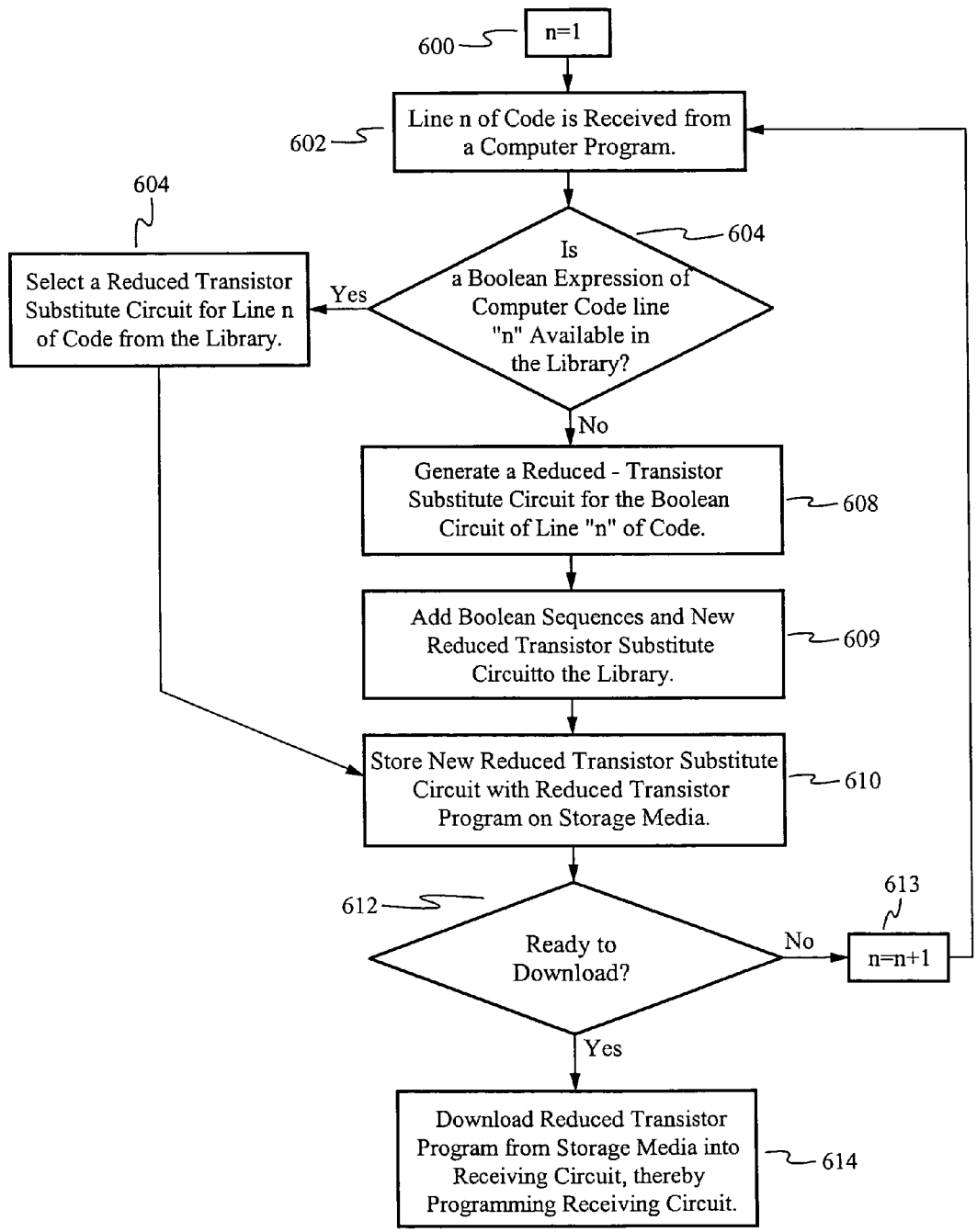
FIG. 16 is a flow chart illustrating a process of progressively building a library according to the lines of code actually used.

The process disclosed in FIG. 16 combines elements of the previous embodiments with an intermediate storage embodiment. FIG. 16 further discloses a developing library embodiment. In order to convert a computer program to reduced transistor circuitry, according to the step 600, the program line number "n" is set to 1, the first line of the computer program. In the step 602, line n of the computer program is received for conversion to a reduced-transistor format. Although the process illustrated in FIG. 16 assumes that a library is available, the process of FIG. 16 can equally be executed in applications where no library is present. A unique feature described in FIG. 16 is that the library need not be preconfigured with substitute circuits. Rather, if the Boolean circuit of line n is available in the library, than in the step 606, a reduced transistor circuit is selected from the library as a substitute for line n of code. On the other hand, if the reduced transistor equivalent of the Boolean expression of line "n" is not available in the library, in the step 608 a circuit generation module generates a reduced-transistor substitute circuit for the Boolean expression of line n. In the step 609, if the Boolean sequence was not available in the library, the Boolean expression is stored in the library along with its corresponding reduced-transistor substitute circuit. In this manner, a library need not be systematically developed to include every possible combination and permutation of logic gates, as illustrated in FIG. 16. Rather, according to the developing library embodiment of steps 602, 604, 606 and 608, the library is developed out of those gating combinations that are actually observed to occur. In this manner, premature filling of library storage space with the exponential production of unlikely gating combinations is avoided. Variations on the developing library embodiment can include a basic library that is further developed in conjunction with forming a reduced-transistor computer program for a particular program, or purging from the library select gating combinations that do not appear to have a high likelihood or frequency of reoccurrence. In the step 610, the reduced-transistor circuit representing line "n" of the computer program is stored on a storage media as line "n" of a reduced-transistor computer program. According to the step 612, if the computer program is not ready to download, then according to the step 613, the line number of the computer program is incremented by one such that n=n+1, and the process returns to the step 602, identifying the next Boolean expression in the program. The process thereby repeats through until the accumulated lines of code converted to reduced-transistor substitute circuits are ready to download. Although the "download ready" point is application dependent, in many applications, the download into a receiving circuit will only be performed when every line of a software program, or every line within a module of a software program has been completely converted to a reduced-transistor expression. In the step 614, the reduced-transistor program is copied from the storage media into the receiving circuit, thereby programming the receiving circuit. The reduced-transistor program can also be copied or broadcast for distribution.

Those skilled in the art will understand that, depending on the operating system, the code defining a reduced-transistor circuit that is stored on a media in the steps 532 and 610 can be appended with an address of a circuit path as it is programmed into a chip, appended with various control codes, compiled, or otherwise altered as it is downloaded from a storage medium into an actual circuit, as taught in the steps 505 and 614. It should be further well understood by those skilled in the art that the binary expression of a circuit stored on a disk or storage medium, is distinct from the actual physical embodiment of a circuit occurring in, for example, a CMOS environment. Because steps such as compiling, un-compiling, adding address, control codes, and similar details are well known in the art, the term "reduced-transistor circuit" as used herein can refer variously to a code representing a reduced-transistor circuit, in any form, or to the physical embodiment of such a circuit such as in a MOS environment, as plainly understood by those skilled in the art.

EXAMPLE

Figure 17:
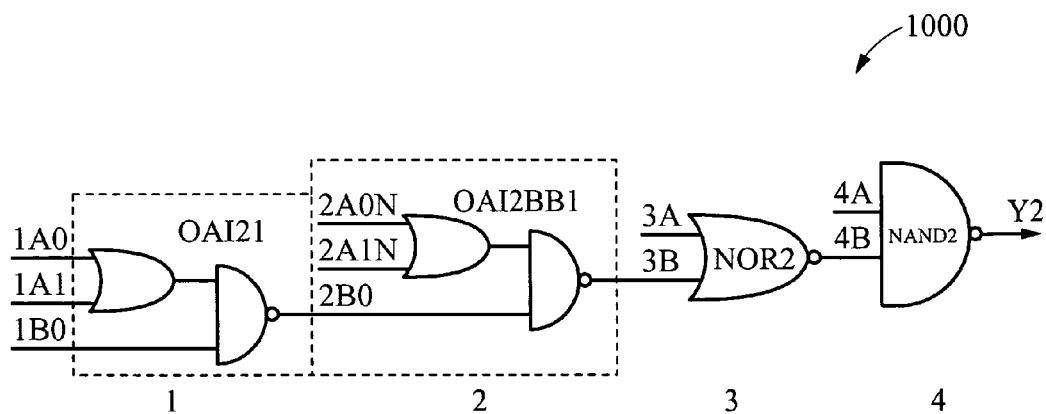
FIG. 17 illustrates an exemplary processing path including four elements.

To illustrate the principles of the present invention, an exemplary processing path, including four elements, is illustrated in FIG. 17. The processing path 1000 includes an OR-AND gate OAI21, an OR-AND gate OAI2BB1, a NOR gate NOR2 and a NAND gate NAND2. The OR-AND gate OAI21 is coupled to receive input signals 1A0, 1A1 and 1B0. An output 2B0 of the OR-AND gate OAI21 is coupled as an input to the OR-AND gate OAI2BB1. The OR-AND gate OAI2BB1 is also coupled to receive input signals 2A0N and 2A1N. An output 3B of the OR-AND gate OAI2BB1 is coupled as an input to the NOR gate NOR2. The NOR gate NOR2 is also coupled to receive an input signal 3A. An output 4B of the NOR gate NOR2 is coupled as an input to the NAND gate NAND2. The NAND gate NAND2 is also coupled to receive an input signal 4A. An output Y2 of the NAND gate NAND2 is the output of the processing path 1000 illustrated in FIG. 17.

Before using the logic optimization of the present invention, the first two cells OAI21 and OAI2BB1 of the processing path 1000 are represented by the equation $$(I0+I1)|(!((!I2+!I3)|(!I4)))$$

The input I0 is equal to the signal 2A1N, which is an input to the OR-AND gate OAI2BB1. The input I1 is equal to the signal 2A0N, which is an input to the OR-AND gate OAI2BB1. The input I2 is equal to the signal 1A0, which is an input to the OR-AND gate OAI21. The input I3 is equal to the signal 1A1, which is an input to the OR-AND gate OAI21. The input I4 is equal to the signal 1B0, which is an input to the OR-AND gate OAI21.

After using logic optimization, the first two cells OAI21 and OAI2BB1 of the processing path 1000 are represented by the equation (I0*I1)+(I3*I4)+(I2*I4)

Figure 18:
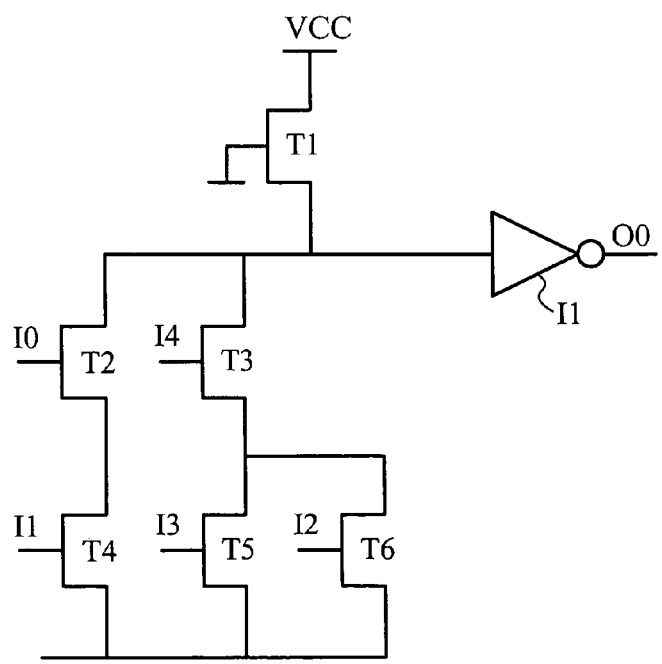
FIG. 18 illustrates a reduced transistor circuit of the first two elements in the exemplary processing path of FIG. 17.

This equation is represented by the reduced transistor circuit illustrated in FIG. 18. The input I0 is coupled to a gate of a transistor T2. The input I1 is coupled to a gate of a transistor T4. The input I2 is coupled to a grate of a transistor T6. The input I3 is coupled to a gate of a transistor T5. The input I4 is coupled to a gate of a transistor T3. The sources of the transistors T4, T5 and T6 are coupled to ground. The drain of the transistor T4 is coupled to the source of the transistor T2. The drains of the transistors T5 and T6 are coupled to each other and to the source of the transistor T3. The drains of the transistors T2 and T3 are coupled to each other, to a source of a transistor T1 and to an input of an inverter I1. A gate of the transistor T1 is coupled to ground. The drain of the transistor T1 is coupled to a voltage source VCC. An output of the inverter I1 is the output of the reduced transistor circuit representing the first two cells OAI21 and OAI2BB1 of the processing path 1000.

Before using the logic optimization of the present invention, all four cells OAI21, OAI2BB1, NOR2 and NAND 2 of the processing path 1000 are represented by the equation (!((!I0*!((I1*I2)+(!((!I3*I4)+(!I5))))))+(!I6))

The input I0 is equal to the signal 3A, which is an input to the NOR gate NOR2. The input I1 is equal to the signal 2A1N, which is an input to the OR-AND gate OAI2BB1. The input I2 is equal to the signal 2A0N, which is an input to the OR-AND gate OAI2BB1. The input I3 is equal to the signal 3A, which is an input to the NOR gate NOR2. The input I4 is equal to the signal 1A1, which is an input to the OR-AND gate OAI21. The input I5 is equal to the signal 1B0, which is an input to the OR-AND gate OAI21. The input I6 is equal to the signal 4A, which is an input to the NAND gate NAND2.

After using logic optimization, the cells of the processing path 1000 are represented by the equation (I1*I2)+(I4*I5)+(I3*I5)+(!I6)+(I0)

Figure 19:
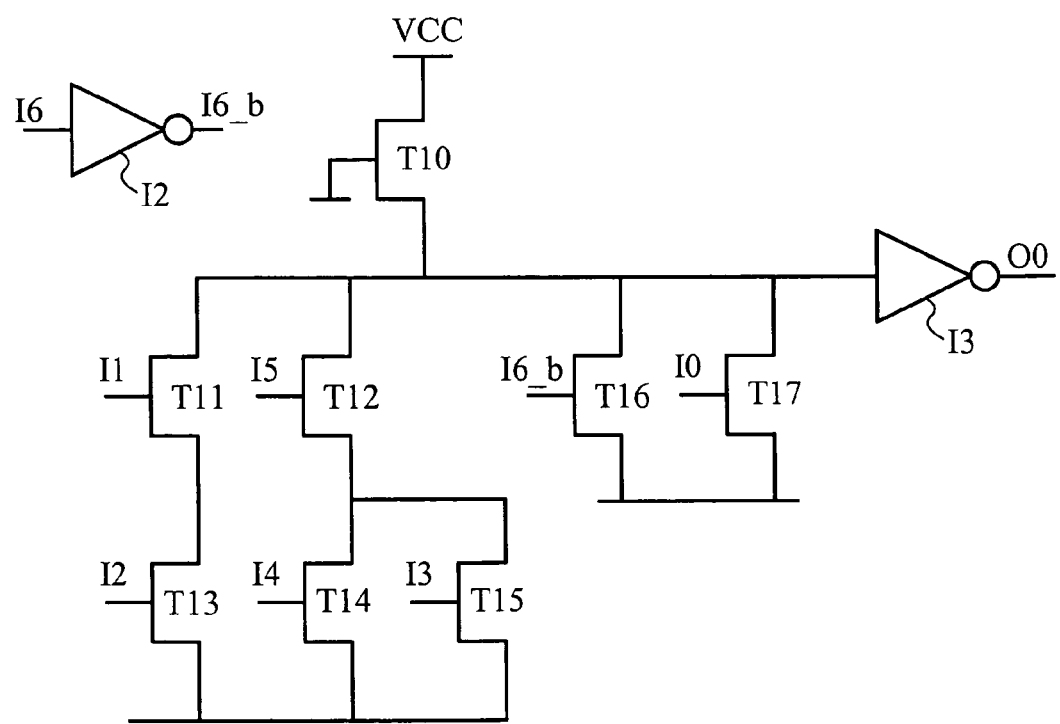
FIG. 19 illustrates a reduced transistor circuit of all four elements of the exemplary processing path of FIG. 17.

This equation is represented by the reduced transistor circuit illustrated in FIG. 19. The input I0 is coupled to a gate of a transistor T17. The input I1 is coupled to a gate of a transistor T11. The input I2 is coupled to a gate of a transistor T13. The input I3 is coupled to a gate of a transistor T15. The input I4 is coupled to a gate of a transistor T14. The input I5 is coupled to a gate of a transistor T12. The input I6 is coupled to an input of an inverter I2. The output of the invertor I2 is the output I6_$b$. The output I6_$b$ is coupled to a gate of the transistor T16. The sources of the transistors T13, T14 and T15 are coupled to ground. The drain of the transistor T13 is coupled to the source of the transistor T11. The drains of the transistors T14 and T15 are coupled to each other and to the source of the transistor T12. The sources of the transistors T16 and T17 are coupled to ground. The drains of the transistors T11, T12, T16 and T17 are coupled to each other, to a source of a transistor T10 and to an input of an inverter I3. A gate of the transistor T10 is coupled to ground. The drain of the transistor T10 is coupled to a voltage source VCC. An output of the inverter I3 is the output of the reduced transistor circuit representing the processing path 1000.

Using the logic optimization of the present invention, the path processing path 1000, illustrated in FIG. 17, is converted into the reduced transistor circuit, illustrated in FIG. 19.

Faster speed, greater processing power, smaller size, and lower power consumption remain the most fundamental goals of microprocessor technology. Microprocessor speed has maintained a dramatic increase in speed for many years, and engineers and computer scientists often speculate when it will reach the point of diminishing returns. The power of an integrated circuit is limited by the clock speed at which the circuit may cycle. The clock speed, in turn, is limited to the speed at which a processing path is able to fully process an incoming set of signals. The present invention reduces the throughput time of a processing path by substituting a reduced-transistor non-Boolean-equivalent circuit in place of a sequence of traditional Boolean logic sequences. This reduction in throughput time increases the speed at which a microprocessor can process data. By reducing the number of transistors in a processing path, the present invention further reduces the power consumed by an integrated circuit and the resulting size of a CMOS chip. By achieving these goals, the present invention enables microprocessor technology and other types of semiconductors to continue to advance in its fundamental goals.

The present invention has been described in terms of specific embodiments incorporating details to facilitate the understanding of the principles of construction and operation of the invention. In many cases, the claimed invention can operate without these additional structures or details, or can be made to function with alternative equivalent structures. It will be apparent to those skilled in the art that many of the details found herein are not essential to the manufacture and use of the claimed invention. Accordingly, such reference herein to specific embodiments and details thereof is not intended to limit the scope of the claims appended hereto.

What is claimed is:

1. A method of designing an integrated circuit comprising:
   a. generating a plurality of sequences of basic Boolean elements respectively defined by a plurality of truth tables;
   b. generating a respective plurality of substituted circuits not definable by a sequence of basic Boolean elements, including a first substitute circuit, wherein the sequence of basic Boolean elements and the respective substitute circuit are defined by a same truth table;
   c. storing the plurality of sequences of basic Boolean elements in a library;
   d. storing the plurality of substitute circuits in the library in a relationship corresponding to their respective sequence of basic Boolean elements;
   e. programming a processing path within the integrated circuit according to the first substitute circuit comprising substitute inputs and a substitute output, wherein the truth table representing the first substitute circuit is identical to the truth table representing a first sequence of basic Boolean elements representing the processing path, and wherein the first substitute circuit is not definable by a sequence of basic Boolean elements;

f. reducing the first sequence of basic Boolean elements into at least one intermediate equivalent circuit; and g. generating the first substituted circuit.

2. The method according to claim 1 further comprising receiving the first sequence of basic Boolean elements.

3. The method according to claim 2 wherein the first sequence of basic Boolean elements is less than or equal to twenty Boolean operators.

4. The method according to claim 2 wherein the first sequence of basic Boolean elements comprises a logical sequence greater than twenty Boolean elements.

5. The method according to claim 2 wherein receiving the first sequence of basic Boolean elements precedes generating a respective plurality of substitute circuits not definable by a sequence of basic Boolean elements, including the first substitute circuit.

6. The method according to claim 1 wherein the processing path further comprises a flip flop at a processing path input.

7. The method according to claim 1 wherein the integrated circuit is a MOS circuit.

8. The method according to claim 1 further comprising
   a. receiving the first sequence of basic Boolean elements; and
   b. searching the library for the first substitute circuit.

9. The method according to claim 8 further comprising:
   a. failing to locate the first sequence of basic Boolean elements within the library;
   b. generating the first substitute circuit; and
   c. adding the first substitute circuit to the library.

10. The method according to claim 8 wherein receiving the first sequence of basic Boolean elements is followed by:
    a. locating the first sequence of basic Boolean elements within the library; and
    b. locating the first substitute circuit within the library corresponding to the first sequence of basic Boolean elements.

11. The method according to claim 8 wherein the library is searched for the first sequence of basic Boolean elements utilizing a search engine.

12. The method according to claim 1 wherein the library is stored within a digital memory.

13. An apparatus for reducing a throughput time of a processing path of basic logic elements within an integrated circuit, the apparatus comprising:
    a. sequence generator for generating a plurality of sequences of Boolean elements, wherein the circuit generation module is configured to generate a complimentary substitute circuit for each sequence of Boolean element generated;
    b. a library for storing the plurality of sequences of Boolean elements such that each Boolean element is stored in a correlation to its complimentary substituted circuit;
    c. a search module for searching the library for a first sequence of Boolean elements;
    d. a retrieval module for retrieving a substitute circuit from the library;
    e. a programming module for programming a first substitute circuit into the processing path of the integrated circuit, wherein the first substitute circuit is not defined by a sequence of Boolean elements, and wherein the first substitute circuit is defined by the truth table identical to a truth table defining the processing path comprised of the sequences of Boolean elements; and
    f. a circuit generation module configured to analyze the first sequence of Boolean elements, reduce the first sequence of Boolean elements into an intermediate circuit sequence and then generate the complimentary substitute circuit.

14. The apparatus according to claim 13 wherein the processing path comprises an input flip flop.

15. The apparatus according to claim 13 wherein the integrated circuit is an MOS circuit.

16. The apparatus according to claim 13 wherein the library is stored on a digital medium.

17. A method of programming a processing path comprising an input flip flop in a MOS integrated circuit comprises:
    a. generating a plurality of sequences of basic Boolean elements respectively defined by a plurality of truth tables;
    b. generating a respective plurality of substitute circuits not definable by a sequence of basic Boolean elements, including a first substitute circuit, wherein the sequence of basic Boolean elements and the respective substitute circuit are defined by a same truth table;
    c. storing the plurality of sequences of basic Boolean elements in a library;
    d. storing the plurality of substitute circuits in the library in a relationship corresponding to their respective sequence of basic Boolean elements;
    e. receiving a first sequence of basic Boolean elements;
    f. reducing the first sequence of basic Boolean elements to an equivalent sequence of elements;
    g. generating a first substitute circuit from the equivalent sequence of elements; and
    h. programming the processing path in the MOS integrated circuit according to the first substitute circuit, wherein the substitute circuit is not definable by a sequence of basic Boolean elements, and wherein the first substitute circuit is generated to define a first truth table that also defines the first sequence of Boolean elements.

* * * * *